US011968782B2

(12) United States Patent
Wang et al.

(10) Patent No.: US 11,968,782 B2
(45) Date of Patent: Apr. 23, 2024

(54) COUPLER AND BASE STATION ANTENNA

(71) Applicant: CommScope Technologies LLC, Hickory, NC (US)

(72) Inventors: Xiaotuo Wang, Suzhou (CN); Changfu Chen, Suzhou (CN); Hangsheng Wen, Suzhou (CN)

(73) Assignee: CommScope Technologies LLC, Claremont, NC (US)

( * ) Notice: Subject to any disclaimer, the term of this patent is extended or adjusted under 35 U.S.C. 154(b) by 55 days.

(21) Appl. No.: 17/386,736

(22) Filed: Jul. 28, 2021

(65) Prior Publication Data

US 2022/0061160 A1 Feb. 24, 2022

(30) Foreign Application Priority Data

Aug. 18, 2020 (CN) .......................... 202010828992.2

(51) Int. Cl.
*H05K 1/14* (2006.01)
*H01Q 1/24* (2006.01)
*H01Q 21/06* (2006.01)

(52) U.S. Cl.
CPC ............. *H05K 1/144* (2013.01); *H01Q 1/246* (2013.01); *H01Q 21/06* (2013.01); *H05K 2201/10098* (2013.01); *H05K 2201/10371* (2013.01)

(58) Field of Classification Search
CPC ......... H05K 1/144; H05K 2201/10098; H05K 2201/10371; H05K 2201/10378; H01Q 21/06; H01Q 1/246
See application file for complete search history.

(56) References Cited

U.S. PATENT DOCUMENTS

| 5,146,191 | A | * | 9/1992 | Mandai | H03H 7/34 333/140 |
| 5,467,064 | A | * | 11/1995 | Gu | H01P 5/12 333/120 |
| 5,815,050 | A | * | 9/1998 | Brooks | H03H 7/34 333/156 |
| 7,579,929 | B2 | * | 8/2009 | Hikino | H01P 1/15 333/128 |
| 11,089,687 | B2 | * | 8/2021 | Nufio-Molina | H05K 1/0219 |
| 2009/0102580 | A1 | * | 4/2009 | Uchaykin | H05K 1/0224 333/185 |

* cited by examiner

*Primary Examiner* — Paresh Paghadal
(74) *Attorney, Agent, or Firm* — Myers Bigel, P.A.

(57) ABSTRACT

The present disclosure relates to a coupler and a base station antenna. The coupler comprises: a first coupling member comprising a first substrate, and a first signal path and a first sub-path of a second signal path located on the first substrate, the first sub-path configured to be at least partially coupled with the first signal path to couple a portion of a signal in the first signal path into the second signal path; a second coupling member vertically stacked with the first coupling member, the second coupling member comprising a second substrate, and a second sub-path of the second signal path located on the second substrate; a shielding member disposed between the first substrate and the second substrate so as to shield the first coupling member and the second coupling member from one another, the shielding member being provided with a first connection through-hole; and a first connection member passing through the first connection through-hole and electrically connected between the first sub-path and the second sub-path.

14 Claims, 6 Drawing Sheets

COUPLER AND BASE STATION ANTENNA

CROSS-REFERENCE TO RELATED APPLICATION

The present application claims the benefit of priority under 35 U.S.C. § 119 to Chinese Patent Application No. 202010828992.2, filed on Aug. 18, 2020, with the China National Intellectual Property Administration, with the entire contents of the above-identified application incorporated by reference as if set forth herein.

TECHNICAL FIELD

The present disclosure relates to the field of communications technologies, and in particular, to couplers and base station antennas.

BACKGROUND

In order to meet increased capacity requirements, larger numbers of antenna arrays are being integrated into base station antennas. As the overall size of the base station antenna is typically not changed, as the number of antenna arrays integrated therein increases, interactions between neighboring antenna arrays may increase, resulting in degradation of the radiation patterns or "antenna beams" generated by the antenna arrays. Specifically, an azimuth beam width (AZBW) of the antenna beam can become wider, thereby resulting in a reduced gain for the antenna array, reduced sector coverage, etc.

SUMMARY

It is among the objectives of the present disclosure to provide a coupler and a base station antenna.

According to a first aspect of the present disclosure, there is provided a coupler comprising: a first coupling member comprising a first substrate, and a first signal path and a first sub-path of a second signal path located on the first substrate, the first sub-path configured to be at least partially coupled with the first signal path to couple a portion of a signal in the first signal path into the second signal path; a second coupling member vertically stacked with the first coupling member, the second coupling member comprising a second substrate, and a second sub-path of the second signal path located on the second substrate; a shielding member disposed between the first substrate and the second substrate so as to shield the first coupling member and the second coupling member from one another, the shielding member being provided with a first connection through-hole; and a first connection member passing through the first connection through-hole and electrically connected between the first sub-path and the second sub-path.

According to a second aspect of the present disclosure, there is provided a base station antenna comprising: a first array of radiating elements comprising a plurality of first radiating elements; a second array of radiating elements comprising a plurality of second radiating elements, wherein an operating frequency band of the second radiating element is same as that of the first radiating element; and the coupler as described above, the coupler configured to couple at least one first radiating element to the second array of radiating elements, and/or to couple at least one second radiating element to the first array of radiating elements.

Other features of the present disclosure and advantages thereof will become more apparent from the following detailed description of exemplary embodiments of the present disclosure, which proceeds with reference to the accompanying drawings.

BRIEF DESCRIPTION OF THE DRAWINGS

The accompanying drawings illustrate example embodiments of the present disclosure and, together with the description, serve to explain the inventive concepts of the present disclosure. In the accompanying drawings.

In the embodiments described herein, in some cases the same portions or portions having similar functions are denoted by the same reference numerals in different drawings, and descriptions of such portions are not repeated. In some cases, similar reference numerals and letters are used to refer to similar items, and thus once an item is defined in one figure, it may not be further discussed with respect to subsequent figures.

In order to facilitate understanding of the present inventive concepts, attributes of the drawings, such as the position, the size, the scale, the range, or the like of each structure illustrated in the drawings and the like may not be accurately represented in some cases. Thus, the disclosure is not necessarily limited to the position, size, range, or the like as disclosed in the drawings. Some features may be enlarged to show details of some specific components.

DETAILED DESCRIPTION

Various exemplary embodiments of the present disclosure will be described in detail herein with reference to the accompanying drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit this disclosure, its application, or its uses. That is to say, structures and methods discussed herein illustrate examples to explain different embodiments according to the present disclosure. It should be understood by those skilled in the art that these examples, while indicating the implementations of the present disclosure, are given by way of illustration only, and not in an exhaustive way.

Techniques, methods and apparatuses known by one of ordinary skill in the relevant art may not be discussed in detail, and are intended to be regarded as a part of the specification where appropriate.

In the examples as illustrated and discussed herein, any specific values should be interpreted to be illustrative only and non-limiting. Thus, other examples of the exemplary embodiments could have different values.

Figure 1:
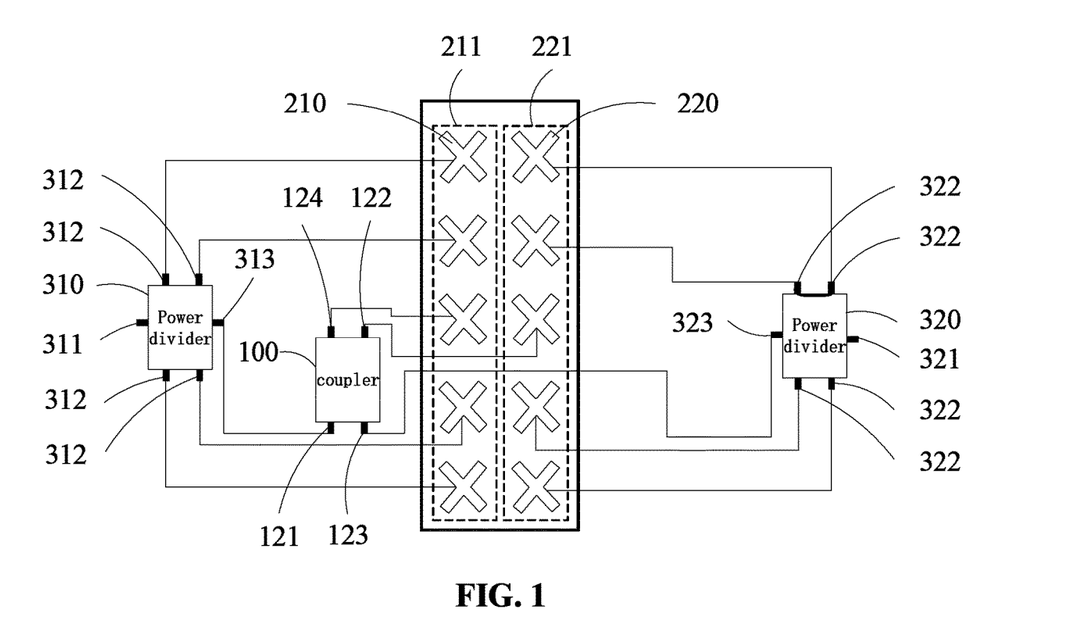
FIG. 1 is a schematic block diagram of a base station antenna.

FIG. 1 is a schematic block diagram of a base station antenna, which can include a first array of radiating elements 210, a second array of radiating elements 220, and a coupler 100. The first array of radiating elements 210 can include a plurality of first radiating elements 211, and the second array of radiating elements 220 can include a plurality of second radiating elements 221. The operating frequency band of the first radiating elements 211 may be the same as that of the second radiating elements 221. As the distance between the first array of radiating elements 210 and the second array of radiating elements 220 decreases, interaction between the first and second radiating elements 211, 221 may increase accordingly, which can result in broadening of the azimuth beam widths (AZBW) of the antenna beams generated by the respective first and second arrays of radiating elements 210, 220.

For example, in a particular example, the first array of radiating elements 210 can generate antenna beams having azimuth beamwidths that provide coverage to a sector of 120 degrees, if sufficiently isolated from the other arrays of radiating elements (e.g., by spacing the arrays sufficiently far apart). Similarly, the second array of radiating elements 220, if sufficiently isolated, can also generate antenna beams having azimuth beamwidths that provide coverage to a 120 degree sector. A full 360 degrees of coverage in the azimuth plane can be achieved by three such sets of first arrays of radiating elements 210 or second arrays of radiating elements 220. However, in practice, since the first array of radiating elements 210 may be affected by the second array of radiating elements 220, the azimuth beamwidth of the antenna beams generated by the first array of radiating elements 210 may increase so that the first array of radiating elements 210 provides coverage outside of the 120 degree sector. Similarly, the azimuth beamwidth of the antenna beams generated by the second array of radiating elements 220 may increase so that the second array of radiating elements 220 also provides coverage outside of a 120 degree sector. As a result, the coverage areas of the first array of radiating elements 210 and the second array of radiating elements 220 may overlap with the coverage areas of the first array of radiating elements 210 and the second array of radiating elements 220 of other antennas of the base station, which results in a decrease in gain and a deterioration in sector coverage for all of the antennas.

In order to solve the above and other problems, a coupler 100 can be provided in the base station antenna. As shown in FIG. 1, the coupler 100 can couple a portion of a signal of the first array of radiating elements 210 into the second array of radiating elements 220, so that according to the interference superposition principle of electromagnetic waves, the AZBW of the first array of radiating elements 210 can be narrowed to improve the performance of the base station antenna. Specifically, the coupler 100 can include a first port 121, a second port 122, a third port 123, and a fourth port 124, where the first port 121 can serve as an input port to receive an input signal, the second port 122 can serve as a coupling port to output a coupling signal from a portion of the input signal, the third port 123 can serve as an isolation port, and the fourth port 124 can serve as an output port to output a remaining portion of the input signal. For simplicity, only one coupler 100 is shown in FIG. 1. It will be appreciated that more couplers 100 can be provided as needed (and coupled to other radiating elements 211, 221) to couple additional portions of the signal of the first array of radiating elements 210 to the second array of radiating elements 220, so as to narrow the AZBW of antenna beams generated by the first array of radiating elements 210 to improve the performance of the antenna. Likewise, one or more additional couplers can be provided to couple a portion of the signal of the second array of radiating elements 220 to the first array of radiating elements 210 so as to narrow the AZBW of antenna beams generated by the second array of radiating elements 220.

The base station antenna can further include power dividers 310 and 320. The power divider 310 can allocate respective portions of a signal received from a port 311 to respective first radiating elements 211 in the first array of radiating elements 210 through respective ports 312, and to the coupler 100 through a port 313. Similarly, the power divider 320 can allocate respective portions of a signal received from a port 321 to respective second radiating elements 221 in the second array of radiating elements 220 through respective ports 322, and to the coupler 100 through a port 323.

It will be appreciated that in the base station antenna shown in FIG. 1, additional arrays of radiating elements can be included, which can be arranged to overlap the first array of radiating elements 210 and the array of second radiating elements 220, or be arranged to be adjacent the first array of radiating elements 210 and the second array of radiating elements 220. In addition, other arrays of radiating elements can operate in the same or different frequency band with the first and second arrays of radiating elements 210, 220. For the arrays of radiating elements operating in the same frequency band, the coupler can be employed to improve the AZBW of each array of radiating elements, and for the arrays of radiating elements operating in different frequency bands, their radiation patterns usually do not interfere with each other, and the operating frequency band of the antenna can be effectively expanded. In some embodiments, the antenna can include arrays of radiating elements that operate using multiple-input multiple-output (MIMO) transmission techniques.

Figure 2:
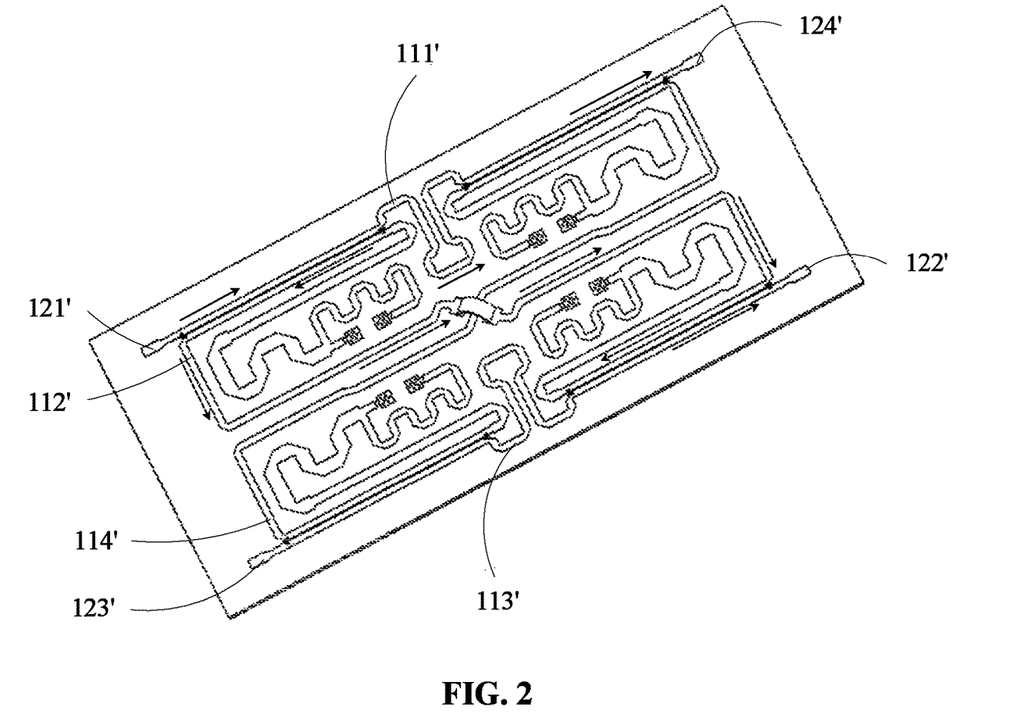
FIG. 2 is a schematic perspective view of a coupler.
Figure 3:
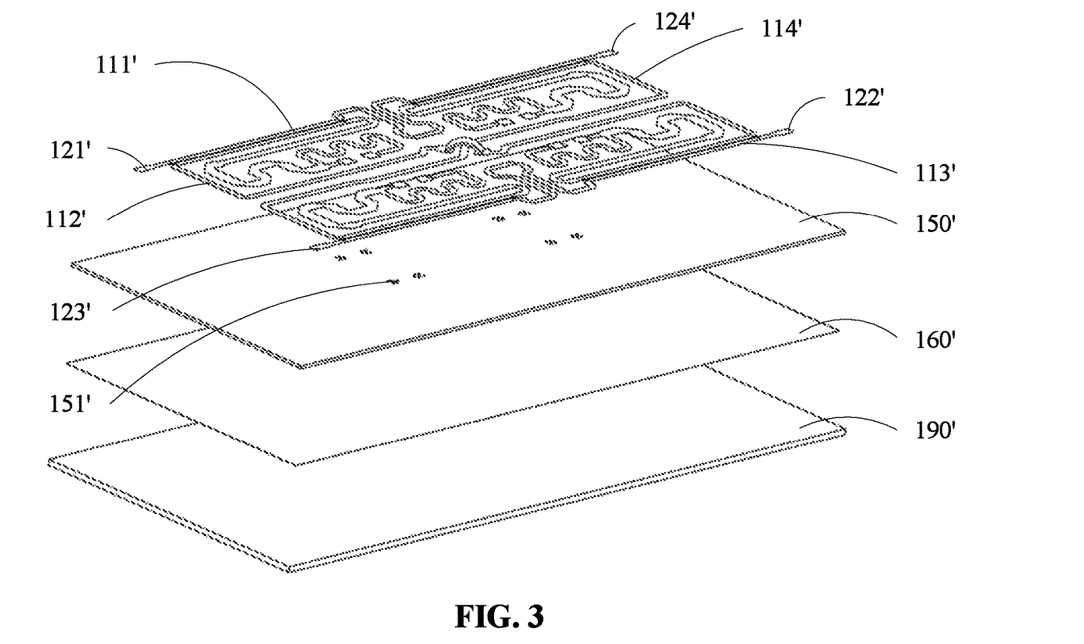
FIG. 3 is an exploded schematic perspective view of the coupler of FIG. 2.

As shown in FIGS. 2 and 3, a coupler used in the base station antenna can be a parallel line coupler, which can include a first signal path 111' between a first port 121' and a fourth port 124', a second signal path 112' between the first port 121' and a second port 122', a third signal path 113' between a third port 123' and the second port 122', and a fourth signal path 114' between the third port 123' and a fourth port 124'.

In a configuration, the first port 121' serves as the input port, the second port 122' serves as the coupling port, the third port 123' serves as the isolation port, and the fourth port 124' serves as the output port. As indicated by solid arrows in FIG. 2, the initial signal can be input from the first port 121' and travel directly to the fourth port 124' via the first signal path 111' for output. In addition, since the first signal path 111' is partially parallel to the second signal path 112' and the second signal path 112' is partially parallel to the third signal path 113', signal coupling can occur, and a portion of the initial signal can be coupled into the second signal path 112', travel along the second signal path 112', and then be coupled into the third signal path 113' to be output from the second port 122', as indicated by dashed arrows in FIG. 2.

Similarly, in another configuration, the first port 121' serves as the isolation port, the second port 122' serves as the output port, the third port 123' serves as the input port, and the fourth port 124' serves as the coupling port. The initial signal can be input from the third port 123' and travel directly to the second port 122' via the third signal path 113' for output. In addition, a portion of the initial signal can be coupled into the fourth signal path 114', travel along the fourth signal path 114', and then be coupled into the first signal path 111' to be output at the fourth port 124'.

An appropriate configuration can be selected according to the requirements on wiring and the like, thereby connecting the coupler in the antenna to improve the performance of the antenna.

The couplers shown in FIGS. 2 and 3 generally have a large area, and thus it may be necessary to reserve a sufficient space in the antenna for them. However, in an antenna including a large number of arrays of radiating elements, the arrangement space for each component tends to be limited, and particularly in the need of a plurality of couplers, the configuration of the antenna may become more difficult.

In order to reduce the amount of space occupied by the coupler, according to an exemplary embodiment of the present disclosure, as shown in FIGS. 4 to 7, the coupler can include a first coupling member, a second coupling member, a shielding member 180, and a first connection member 191. The first coupling member, the shielding member 180, and the second coupling member can be vertically stacked in this order. In some embodiments, the first coupling member can be a printed circuit board, including a single layer printed circuit board. Similarly, the second coupling member can also be a printed circuit board, including a single layer printed circuit board. The shielding member 180 can be formed of a metal plate, which can shield the first coupling member and the second coupling member from one another, to prevent a signal path on the first coupling member and a signal path on the second coupling member, which will be described below, from interfering with each other, thereby improving signal transmission.

As shown in FIGS. 4 to 7, the first coupling member can include a first substrate 151, and a first signal path 111 and a first sub-path 1121 of a second signal path 112 located on the first substrate 151, wherein the first sub-path 1121 can be configured to be at least partially coupled with the first signal path 111 to couple a portion of a signal in the first signal path 111 into the second signal path 112. The second coupling member can include a second substrate 152, and a second sub-path 1122 of the second signal path 112 located on the second substrate 152. The first sub-path 1121 located on the first substrate 151 and the second sub-path 1122 located on the second substrate 152 can be connected together by a first connection member 191 to form the second signal path 112, and the second signal path 112 can participate in transmission of a coupling signal, which can be a portion of the initial signal in the first signal path 111.

In order to provide the first connection member 191, the shielding member 180 can be provided with a first connection through-hole 181, and the first connection member 191 can pass through the first connection through-hole 181 to connect the first sub-path 1121 and the second sub-path 1122.

In an exemplary embodiment of the present disclosure, by forming signal paths that were originally on the same plane on two different and vertically stacked planes, an area required for the signal paths can be effectively reduced, and thereby the size of the coupler can be reduced. Also, the shielding member 180 disposed between the different planes where the signal paths are located can avoid interference between the signal paths located on the different planes, thereby improving the performance of the coupler.

In some cases, the coupling signal in the second sub-path 1122 can be output directly. In other cases, as shown in FIGS. 4 to 7, the second coupling member can further include a third signal path 113 located on the second substrate 152, and the third signal path 113 can be configured to be at least partially coupled with the second sub-path 1122, to couple a portion of the signal in the second signal path 112 into the third signal path 113.

Due to the coupling between the second sub-path 1122 and the third signal path 113, a magnitude of the resulting coupling signal can be further reduced, thereby helping adjust the AZBW of the respective array of radiating elements in the antenna more accurately.

Furthermore, in some embodiments, the third signal path 113 can be provided in a manner similar to that of the first signal path 111. As such, the initial signal can be first input into the third signal path 113, and then a portion thereof is coupled into the second sub-path 1122, travels into the first sub-path 1121 along the second signal path 112, and is then coupled into the first signal path 111 for output. In practical operations, appropriate paths for the initial signal and the coupling signal can be selected according to the connection mode, the wiring requirement and/or the like of the coupler in the antenna.

Similar to the arrangement of the second signal path 112, a fourth signal path 114 can also be arranged in the coupler to provide a redundant path, so as to facilitate selection of appropriate paths for the initial signal and the coupling signal in actual operations according to the connection mode, the wiring requirements and/or the like of the coupler in the antenna. As shown in FIGS. 4 to 7, the second coupling member can include a third sub-path 1143 of the fourth signal path 114 located on the second substrate 152, and the third sub-path 1143 can be configured to be at least partially coupled with the third signal path 113 to couple a portion of a signal in the third signal path 113 into the fourth signal path 114. The first coupling member can also include a fourth sub-path 1144 of the fourth signal path 114 located on the first substrate 151. The third sub-path 1143 located on the second substrate 152 and the fourth sub-path 1144 located on the first substrate 151 can be connected together by a second connection member 192 to form the fourth signal path 114, and the fourth signal path 114 can participate in the transmission of the coupling signal, which can be a portion of the initial signal in the third signal path 113.

In order to provide the second connection member 192, the shielding member 180 can further be provided with a second connection through-hole 182, and the second connection member 192 can pass through the second connection through-hole 182 to connect the third sub-path 1143 and the fourth sub-path 1144.

In some cases, the coupling signal in the fourth sub-path 1144 can be output directly. In other cases, as shown in FIGS. 4 to 7, the first signal path 111 can also be configured to be at least partially coupled with the fourth sub-path 1144 to couple a portion of a signal in the fourth signal path 114 into the first signal path 111. Due to the coupling between the fourth sub-path 1144 and the first signal path 111, a magnitude of the resulting coupling signal can be further reduced, thereby helping adjust the AZBW of the respective array of radiating elements in the antenna more accurately.

In some exemplary embodiments, at least four different signal paths can be provided on different planes of the coupler to achieve different coupling requirements, and effectively reduce the size of the coupler, thereby helping utilize the space in the antenna efficiently.

Further, in order that the coupling signal is in phase with a portion of the initial signal directly output via the first signal path 111 or the third signal path 113, so as to reduce the AZBW of the respective array of radiating elements through interference superposition of electromagnetic waves, a length of each signal path may be considered and/or limited. That is, a first length of the first signal path 111 and a second length of the second signal path 112 may be configured such that a portion of the signal that results from passing through the first signal path 111 is in phase with another portion of the signal that results from passing through the second signal path 112; and a third length of the third signal path 113 and a fourth length of the fourth signal path 114 may be configured such that a portion of the signal that results from passing through the third signal path 113 is in phase with another portion of the signal that results from passing through the fourth signal path 114. By adjusting a curved shape of at least one of the first signal path 111, the second signal path 112, the third signal path 114, and the fourth signal path 114, the length of each signal path can be adjusted while keeping a total area occupied by the signal paths unchanged as much as possible.

In some embodiments, the first length of the first signal path 111 can be equal to the third length of the third signal path 113, and/or the second length of the second signal path 112 can be equal to the fourth length of the fourth signal path 114.

In some embodiments, as shown in FIGS. 4 to 7, the second length of the second signal path 112 can be greater than the first length of the first signal path 111, and/or the fourth length of the fourth signal path 114 can be greater than the third length of the third signal path 113.

As shown in FIGS. 4 to 7, the coupler can be a parallel line coupler. A first coupling segment 111*a* of the first signal path 111 can be parallel to a first sub-segment 1121*a* of the first sub-path 1121 so that the first signal path 111 is coupled with the first sub-path 1121. Similarly, a fourth coupling segment 111*d* of the first signal path 111 can be parallel to a fourth sub-segment 1144*d* of the fourth sub-path 1144 so that the first signal path 111 is coupled with the fourth sub-path 1144. In the same way, a second coupling segment 113*b* of the third signal path 113 can be parallel to a second sub-segment 1122*b* of the second sub-path 1122 so that the third signal path 113 can be coupled with the second sub-path 1122, and a third coupling segment 113*c* of the third signal path 113 can be parallel to a third sub-segment 1143*c* of the third sub-path 1143 so that the third signal path 113 is coupled with the third sub-path 1143.

It is noted that in the parallel line coupler, a travelling direction of an initial signal in a path is opposite to a travelling direction of a coupling signal coupled into another path from the initial signal. That is, the signal traveling direction in the first coupling segment 111*a* is opposite to the signal traveling direction in the first sub-segment 1121*a*, the signal traveling direction in the fourth coupling segment 111*d* is opposite to the signal traveling direction in the fourth sub-segment 1144*d*, the signal traveling direction in the second coupling segment 113*b* is opposite to the signal traveling direction in the second sub-segment 1122*b*, and the signal traveling direction in the third coupling segment 113*c* is opposite to the signal traveling direction in the third sub-segment 1143*c*.

Figure 5:
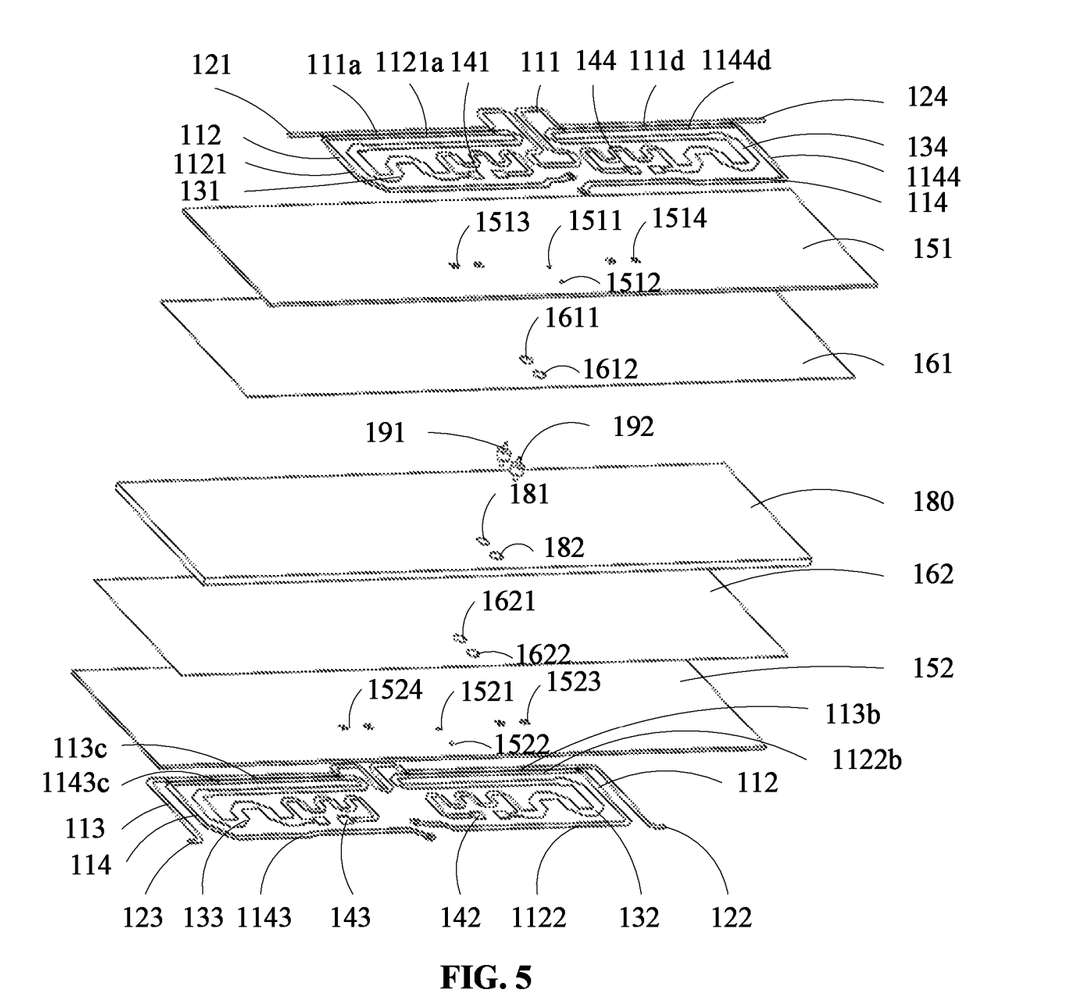
FIG. 5 is an exploded schematic perspective view of the coupler of FIG. 4.
Figure 7:
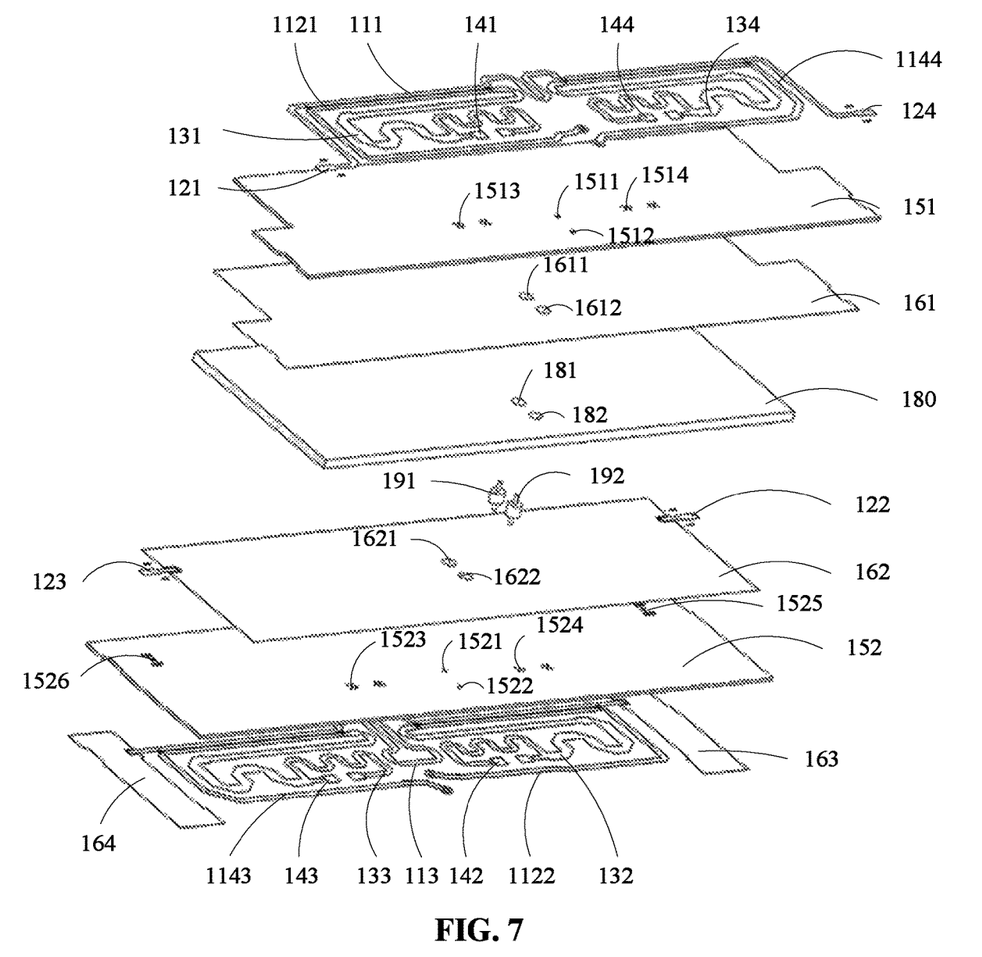
FIG. 7 is an exploded schematic perspective view of the coupler of FIG. 6.

As shown in FIGS. 5 and 7, in some exemplary embodiments of the present disclosure, the first sub-path 1121 and the fourth sub-path 1144 can be disposed side-by-side on the same side of the first substrate 151; and the second sub-path 1122 and the third sub-path 1143 can be disposed side-by-side on the same side of the second substrate 152, to fully utilize the space on the first substrate 151 and the second substrate 152 to dispose the respective paths. In addition, as shown in FIG. 5, the first sub-path 1121 and the third sub-path 1143 can be vertically stacked; and the fourth sub-path 1144 and the second sub-path 1122 can be vertically stacked to reduce the required areas of the first substrate 151 and the second substrate 152.

To facilitate the signal input to and output from the coupler, as shown in FIGS. 4 to 7, the first coupling member can further include a first port 121 and a fourth port 124 located on the first substrate 151, wherein the first port 121 can be connected to one end of the first signal path 111 close to the first sub-path 1121, and the fourth port 124 can be connected to the other end of the first signal path 111 close to the fourth sub-path 1144. Similarly, the second coupling member can further include a second port 122 and a third port 123 located on the second substrate 152, wherein the second port 122 can be connected to one end of the third signal path 113 close to the second sub-path 1122, and the third port 123 can be connected to the other end of the third signal path 113 close to the third sub-path 1143.

In the coupler, any one of the first port 121, the second port 122, the third port 123 and the fourth port 124 can be used as the input port, and accordingly, the output port, the coupling port and the isolation port can be changed to facilitate connection of the coupler to other components in different antennas. For example, when the first port 121 serves as the input port, the fourth port 124 can serve as the output port, the second port 122 can serve as the coupling port, and the third port 123 can serve as the isolation port. Alternatively, when the third port 123 serves as the input port, the second port 122 can serve as the output port, the fourth port 124 can serve as the coupling port, and the first port 121 can serve as the isolation port.

Figure 6:
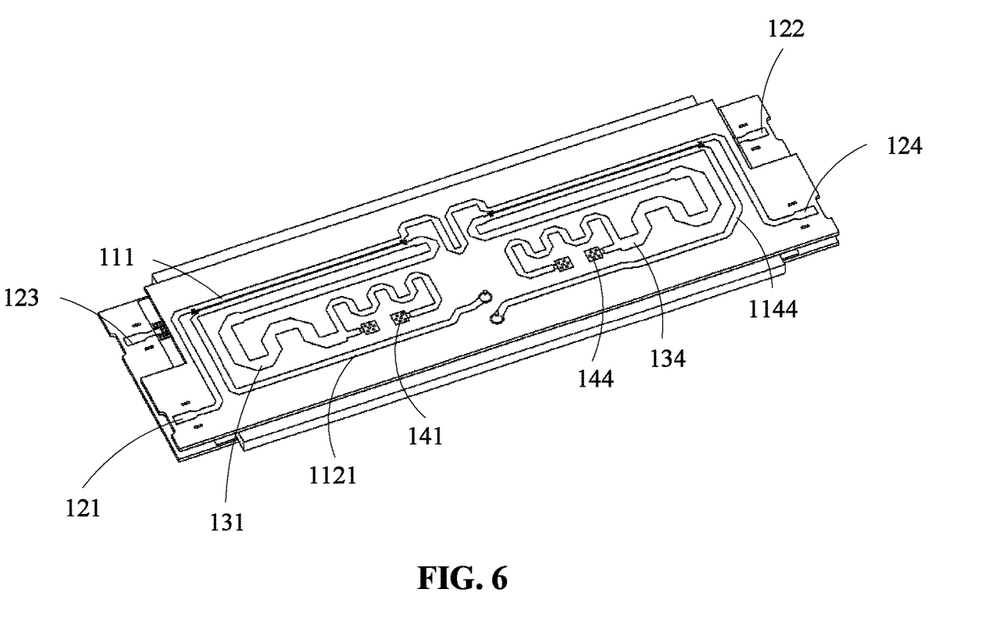
FIG. 6 is a schematic perspective view of a coupler according to another exemplary embodiment of the present disclosure.

As shown in FIGS. 5 to 7, projections of the first port 121, the second port 122, the third port 123, and the fourth port 124 in the vertical direction can be spaced apart from one another, to facilitate connection of the coupler to another component in the antenna.

In addition, in the configuration where the first sub-path 1121 and the third sub-path 1143 are vertically stacked, and the fourth sub-path 1144 and the second sub-path 1122 are vertically stacked, the output port and the coupling port can be located at one end of the coupler, while the input port and the isolation port can be located at the other end of the coupler, so as to facilitate connecting the coupler to another component.

In order to improve the isolation performance of the coupler, as shown in FIGS. 4 to 7, the first coupling member can further include a first absorption path 131 and a first absorption member 141, and a fourth absorption path 134 and a fourth absorption member 144 that are located on the first substrate 151. The first absorption path 131 can connect the first sub-segment 1121*a* of the first sub-path 1121 and the first absorption member 141, the fourth absorption path 134 can connect the fourth sub-segment 1144*d* of the fourth sub-path 1144 and the fourth absorption member 144. Similarly, the second coupling member can further include a second absorption path 132 and a second absorption member 142, and a third absorption path 133 and a third absorption member 143 located on the second substrate 152. The second absorption path 132 can connect the second sub-segment 1122*b* of the second sub-path 1122 and the second absorption member 142, the third absorption path 133 can connect the third sub-segment 1143*c* of the third sub-path 1143 and the third absorption member 143.

In some embodiments, at least one of the first absorption member 141, the second absorption member 142, the third absorption member 143, and the fourth absorption member 144 can include a resistor. In order to improve the calibration performance of the coupler, at least one of the first absorption member 141, the second absorption member 142, the third absorption member 143, and the fourth absorption member 144 can further include two resistors disposed in parallel. The resistance of each of the two resistors can be 50 ohms. It will be appreciated that in other embodiments, other absorption members and/or resistances can be provided to achieve the desired performance.

As shown in FIGS. 5 and 7, the first coupling member can further include a first grounding member 161, and the first grounding member 161 can be located on a different side of the first substrate 151 with respect to the first and fourth absorption members 141 and 144. In some embodiments, the first grounding member 161 can be formed of a metal layer and vertically stacked with the first substrate 151. Also, the first absorption member 141 can be electrically connected to the first grounding member 161 via a first conductive through-hole 1513 on the first substrate 151, and the fourth absorption member 144 can be electrically connected to the first grounding member 161 via a fourth conductive through-hole 1514 on the first substrate 151. In the same way, the second coupling member can further include a second grounding member 162, and the second grounding member 162 can be located on a different side of the second substrate 152 with respect to the second and third absorbing members 142 and 143. In some embodiments, the second grounding member 162 can also be formed of a metal layer and vertically stacked with the second substrate 152. Also, the second absorption member 142 can be electrically connected to the second grounding member 162 via a second conductive through-hole 1523 on the second substrate 152, and the third absorption member 143 can be electrically connected to the second grounding member 162 via a third conductive through-hole 1524 on the second substrate 152.

In some embodiments, the shielding member 180 can be electrically connected with the first and second grounding members 161 and 162 such that the first coupling member is commonly grounded with the second coupling member.

In some exemplary embodiments of the present disclosure, as shown in FIG. 5, the first signal path 111, the first sub-path 1121, the fourth sub-path 1144, the first absorption path 131, the fourth absorption path 134, the first absorption member 141, and the fourth absorption member 144 are located on a first side (an upper side shown in FIG. 5) of the first substrate 151, and the first grounding member 161 is located on an opposite second side (a lower side shown in FIG. 5) of the first substrate 151. Moreover, the first substrate 151 is provided with a first non-conductive through-hole 1511 and a second non-conductive through-hole 1512, and the first grounding member is provided with a third connection through-hole 1611 and a fourth connection through-hole 1612. Also, the second grounding member 162 is located on a first side (an upper side shown in FIG. 5) of the second substrate 152, and the third signal path 113, the second sub-path 1122, the third sub-path 1143, the second absorption path 132, the third absorption path 133, the second absorption member 142, and the third absorption member 143 are located on an opposite second side (a lower side shown in FIG. 5) of the second substrate 152. The second substrate 152 is provided with a third non-conductive through-hole 1521 and a fourth non-conductive through-hole 1522, and the second grounding member 162 is provided with a fifth connection through-hole 1621 and a sixth connection through-hole 1622. Based on the above configuration, the first connection member 191 can pass through the first non-conductive through-hole 1511, the third connection through-hole 1611, the first connection through-hole 181, the fifth connection through-hole 1621, and the third non-conductive through-hole 1521 in this order to connect the first sub-path 1121 to the second sub-path 1122, and the second connection member 192 can pass through the fourth non-conductive through-hole 1512, the sixth connection through-hole 1612, the second connection through-hole 182, the fourth connection through-hole 1622, and the second non-conductive through-hole 1522 in this order to connect the third sub-path 1143 to the fourth sub-path 1144.

To facilitate the connection, the first non-conductive through-hole 1511, the third connection through-hole 1611, the first connection through-hole 181, the fifth connection through-hole 1621, and the third non-conductive through-hole 1521 can overlap in the vertical direction so that the first connection member 191 can directly pass through these holes. In the same way, the fourth non-conductive through-hole 1512, the sixth connection through-hole 1612, the second connection through-hole 182, the fourth connection through-hole 1622, and the second non-conductive through-hole 1522 can overlap in the vertical direction so that the second connection member 192 can directly pass through these holes.

In some embodiments, the first connection member 191 can include a first inner conductor and a first dielectric layer surrounding the first inner conductor, wherein the first inner conductor can be connected between the first sub-path 1121 and the second sub-path 1122, and the first dielectric layer can electrically insulate the first inner conductor from the first substrate 151, the first grounding member 161, the shielding member 180, the second grounding member 162, and the second substrate 152. Similarly, the second connection member 192 can include a second inner conductor and a second dielectric layer surrounding the second inner conductor, the second inner conductor can be connected between the third sub-path 1143 and the fourth sub-path 1144, and the second dielectric layer can electrically insulate the second inner conductor from the second substrate 152, the second grounding member 162, the shielding member 180, the first grounding member 161, and the first substrate 151. Such a first connection member 191 can form a structure similar to a coaxial cable with the shielding member 180, where the shielding member 180 corresponds to an outer conductor of the coaxial cable. Similarly, the second connection member 192 can also form a structure similar to a coaxial cable with the shielding member 180.

Figure 4:
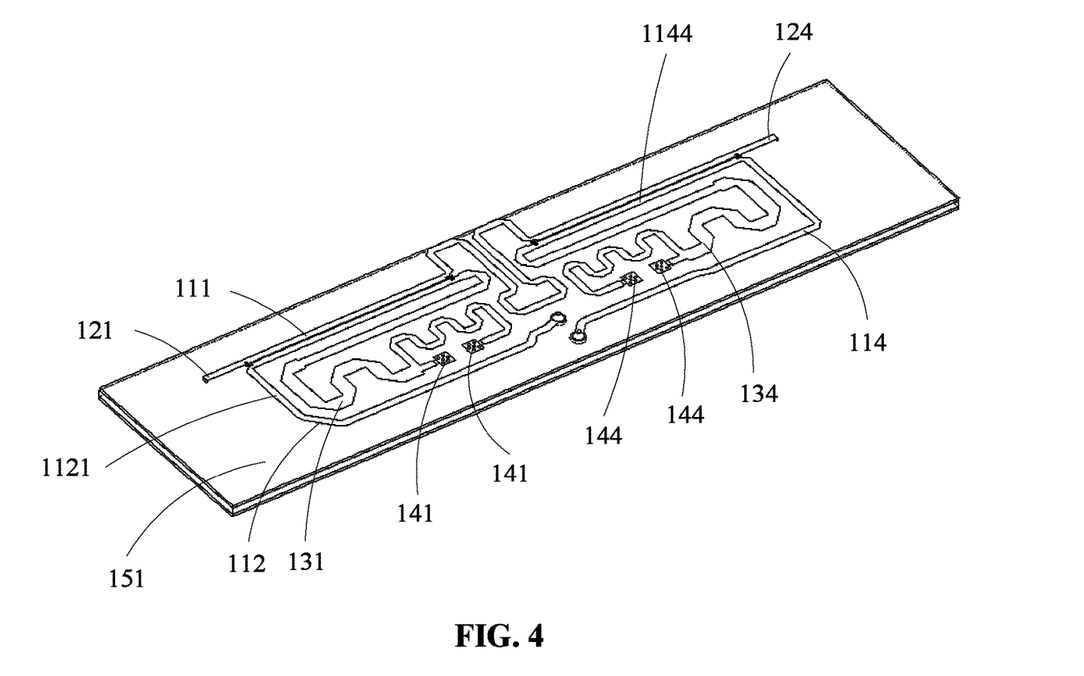
FIG. 4 is a schematic perspective view of a coupler according to an exemplary embodiment of the present disclosure.

As shown in FIGS. 4 and 5, in an exemplary embodiment, the first port 121 and the fourth port 124 can be located on the first side of the first substrate 151, and the second port 122 and the third port 123 can be located on the second side of the second substrate 152. In this way, the first coupling member and the second coupling member can be prepared in a similar manner, thereby reducing the process cost.

However, in the arrangement shown in FIGS. 4 and 5, when the second port 122 and the third port 123 are connected to another component in the base station antenna, a connection operation such as soldering may be required to be made from the rear surface of the coupler, causing inconvenience. Thus, according to another exemplary embodiment of the present disclosure, as shown in FIGS. 6 and 7, the second port 122 and the third port 133 can be located on the first side of the second substrate 152. In order to realize the connection, the second substrate 152 can be further provided with a fifth conductive through-hole 1525 and a sixth conductive through-hole 1526. As such, the second port 122 can be electrically connected to the second sub-path 1122 via the fifth conductive through-hole 1525, and the third port 123 can be electrically connected to the third sub-path 1143 via the sixth conductive through-hole 1526. In addition, the second coupling member can further include a third grounding member 163 and a fourth grounding member 164 located on the second side of the second substrate 152, the third grounding member 163 can be configured to serve as a ground terminal of the second port 122, and the fourth grounding member 164 can be configured to serve as a ground terminal of the third port 123. By providing the third and fourth grounding members 163 and 164 on the second side opposite to the first side where the second and third ports 122 and 123 are located, uniformity of grounding throughout the coupler can be achieved, as the thicknesses of the first and second substrates 151 and 152 can be substantially uniform.

In addition, the implementations of the present disclosure may also include the following examples:

A coupler comprising: a first coupling member comprising a first substrate, and a first signal path and a first sub-path of a second signal path located on the first substrate, the first sub-path configured to be at least partially coupled with the first signal path to couple a portion of a signal in the first signal path into the second signal path; a second coupling member vertically stacked with the first coupling member, the second coupling member comprising a second substrate and a second sub-path of the second signal path located on the second substrate; a shielding member disposed between the first substrate and the second substrate so as to shield the first coupling member and the second coupling member from one another, the shielding member being provided with a first connection through-hole; and a first connection member passing through the first connection through-hole and electrically connected between the first sub-path and the second sub-path.

In some implementations, the second coupling member further comprises a third signal path located on the second substrate, the third signal path configured to be at least partially coupled with the second sub-path to couple a portion of a signal in the second signal path into the third signal path.

In some implementations, the second coupling member further comprises a third sub-path of a fourth signal path located on the second substrate, the third sub-path configured to be at least partially coupled with the third signal path to couple a portion of a signal in the third signal path into the fourth signal path; the first coupling member further comprises a fourth sub-path of the fourth signal path located on the first substrate; the shielding member is further provided with a second connection through-hole; and the coupler further comprises a second connection member passing through the second connection through-hole and electrically connected between the third sub-path and the fourth sub-path.

In some implementations, the first signal path is further configured to be at least partially coupled with the fourth sub-path to couple a portion of a signal in the fourth signal path into the first signal path.

In some implementations, a first length of the first signal path and a second length of the second signal path are configured such that a portion of a signal that results from passing through the first signal path is in phase with another portion of the signal that results from passing through the second signal path; and a third length of the third signal path and a fourth length of the fourth signal path are configured such that a portion of a signal that results from passing through the third signal path is in phase with another portion of the signal that results from passing through the fourth signal path.

In some implementations, the first length is equal to the third length; and/or the second length is equal to the fourth length.

In some implementations, wherein the second length is greater than the first length; and/or the fourth length is greater than the third length.

In some implementations, a first coupling segment of the first signal path is parallel to a first sub-segment of the first sub-path such that the first signal path is coupled with the first sub-path, and a fourth coupling segment of the first signal path is parallel to a fourth sub-segment of the fourth sub-path such that the first signal path is coupled with the fourth sub-path; and a second coupling segment of the third signal path is parallel to a second sub-segment of the second sub-path such that the third signal path is coupled with the second sub-path, and a third coupling segment of the third signal path is parallel to a third sub-segment of the third sub-path such that the third signal path is coupled with the third sub-path.

In some implementations, a signal travelling direction in the first coupling segment is opposite a signal travelling direction in the first sub-segment; a signal travelling direction in the fourth coupling segment is opposite a signal travelling direction in the fourth sub-segment; a signal travelling direction in the second coupling segment is opposite a signal travelling direction in the second sub-segment; and a signal travelling direction in the third coupling segment is opposite a signal travelling direction in the third sub-segment.

In some implementations, the first sub-path and the fourth sub-path are disposed side-by-side on a same side of the first substrate; and the second sub-path and the third sub-path are disposed side-by-side on a same side of the second substrate.

In some implementations, the first sub-path is vertically stacked with the third sub-path; and the second sub-path is vertically stacked with the fourth sub-path.

In some implementations, the first coupling member further comprises a first port and a fourth port located on the first substrate, the first port connected to one end of the first signal path close to the first sub-path, the fourth port connected to the other end of the first signal path close to the fourth sub-path; and the second coupling member further comprises a second port and a third port located on the second substrate, the second port connected to one end of the third signal path close to the second sub-path, the third port connected to the other end of the third signal path close to the third sub-path.

In some implementations, projections of the first port, the second port, the third port, and the fourth port in a vertical direction are spaced apart from one another.

In some implementations, the first coupling member further comprises: a first absorption path and a first absorption member located on the first substrate, the first absorption path connecting a first sub-segment of the first sub-path that is coupled with the first signal path and the first absorption member; a fourth absorption path and a fourth absorption member located on the first substrate, the fourth absorption path connecting a fourth sub-segment of the fourth sub-path that is coupled with the first signal path and the fourth absorption member; and the second coupling member further comprises: a second absorption path and a second absorption member located on the second substrate, the second absorption path connecting a second sub-segment of the second sub-path that is coupled with the third signal path and the second absorption member; a third absorption path and a third absorption member located on the second substrate, the third absorption path connecting a third sub-segment of the third sub-path that is coupled with the third signal path and the third absorption member.

In some implementations, at least one of the first absorption member, the second absorption member, the third absorption member, and the fourth absorption member comprises a resistor.

In some implementations, at least one of the first absorption member, the second absorption member, the third absorption member, and the fourth absorption member comprises two resistors arranged in parallel.

In some implementations, the first coupling member further comprises a first grounding member located on an opposite side of the first substrate with respect to the first absorption member and the fourth absorption member, the first absorption member electrically connected with the first grounding member via a first conductive through-hole on the first substrate, and the fourth absorption member electrically connected with the first grounding member via a fourth conductive through-hole on the first substrate; and the second coupling member further comprises a second grounding member located on an opposite side of the second substrate with respect to the second absorption member and the third absorption member, the second absorption member electrically connected with the second grounding member via a second conductive through-hole on the second substrate, and the third absorption member electrically connected with the second grounding member via a third conductive through-hole on the second substrate.

In some implementations, the shielding member is electrically connected between the first grounding member and the second grounding member.

In some implementations, the first signal path, the first sub-path, the fourth sub-path, the first absorption path, the fourth absorption path, the first absorption member, and the fourth absorption member are located on a first side of the first substrate, the first grounding member is located on an opposite second side of the first substrate, the first substrate being provided with a first non-conductive through-hole and a second non-conductive through-hole, the first grounding member being provided with a third connection through-hole and a fourth connection through-hole; the second grounding member is located on a first side of the second substrate, the third signal path, the second sub-path, the third sub-path, the second absorption path, the third absorption path, the second absorption member and the third absorption member are located on an opposite second side of the second substrate, the second substrate being provided with a third non-conductive through-hole and a fourth non-conductive through-hole, the second grounding member being provided with a fifth connection through-hole and a sixth connection through-hole; the first connection member passes through the first non-conductive through-hole, the third connection through-hole, the first connection through-hole, the fifth connection through-hole, and the third non-conductive through-hole in this order to connect the first sub-path to the second sub-path; the second connection member passes through the fourth non-conductive through-hole, the sixth connection through-hole, the second connection through-hole, the fourth connection through-hole, and the second non-conductive through-hole in this order to connect the third sub-path to the fourth sub-path.

In some implementations, the first non-conductive through-hole, the third connection through-hole, the first connection through-hole, the fifth connection through-hole, and the third non-conductive through-hole overlap in a vertical direction; and the fourth non-conductive through-hole, the sixth connection through-hole, the second connection through-hole, the fourth connection through-hole, and the second non-conductive through-hole overlap in a vertical direction.

In some implementations, the first connection member comprises a first inner conductor and a first dielectric layer surrounding the first inner conductor, the first inner conductor connected between the first sub-path and the second sub-path, the first dielectric layer electrically insulating the first inner conductor relative to the first substrate, the first grounding member, the shielding member, the second grounding member, and the second substrate; and/or the second connection member comprises a second inner conductor and a second dielectric layer surrounding the second inner conductor, the second inner conductor connected between the third sub-path and the fourth sub-path, the second dielectric layer electrically insulating the second inner conductor relative to the second substrate, the second grounding member, the shielding member, the first grounding member, and the first substrate.

In some implementations, the first port and the fourth port are located on the first side of the first substrate.

In some implementations, the second port and the third port are located on the second side of the second substrate.

In some implementations, the second port and the third port are located on the first side of the second substrate; the second coupling member further comprises a third grounding member and a fourth grounding member located on the second side of the second substrate, and the second substrate is further provided with a fifth conductive through-hole and a sixth conductive through-hole; the second port is electrically connected with the second sub-path via the fifth conductive through-hole, the third grounding member is configured to serve as a ground terminal of the second port, and the third port is electrically connected with the third sub-path via the sixth conductive through-hole, the fourth grounding member is configured to serve as a ground terminal of the third port.

In some implementations, the first grounding member comprises a first metal layer vertically stacked with the first substrate; and/or the second grounding member comprises a second metal layer vertically stacked with the second substrate.

In some implementations, the first coupling member comprises a first printed circuit board; and/or the second coupling member comprises a second printed circuit board.

According to some implementations, the base station antenna comprises: a first array of radiating elements comprising a plurality of first radiating elements; a second array of radiating elements comprising a plurality of second radiating elements, and an operating frequency band of the second radiating element being the same as that of the first radiating element; and any of the couplers herein, the coupler configured to couple at least one first radiating element to the second array of radiating elements, and/or to couple at least one second radiating element to the first array of radiating elements.

In some implementations, the base station antenna comprises a multiple-input multiple-output antenna The terms "front," "back," "top," "bottom," "over," "under" and the like, as used herein, if any, are used for descriptive purposes and not necessarily for describing permanent relative positions. It should be understood that such terms are interchangeable under appropriate circumstances such that the embodiments of the disclosure described herein are, for example, capable of operation in other orientations than those illustrated or otherwise described herein.

The term "exemplary," as used herein, means "serving as an example, instance, or illustration," rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, summary, or detailed description.

The term "substantially," as used herein, is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

In addition, the foregoing description may refer to elements or nodes or features being "connected" or "coupled" together. As used herein, unless expressly stated otherwise, "connected" means that one element/node/feature is electrically, mechanically, logically or otherwise joined to (or communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology, such as the terms "first," "second" and the like, may also be used in the following description for the purpose of reference only, and thus are not intended to be limiting. For example, the terms "first," "second" and other such numerical terms referring to structures or elements do not imply a sequence or order unless clearly indicated by the context.

Further, it should be noted that, the terms "comprise," "include," "have" and any other variants, as used herein, specify the presence of stated features, integers, steps, operations, elements, and/or components, but do not preclude the presence or addition of one or more other features, integers, steps, operations, elements, components, and/or groups thereof.

In this disclosure, the term "provide" is intended in a broad sense to encompass all ways of obtaining an object, thus the expression "providing an object" includes but is not limited to "purchasing," "preparing/manufacturing," "disposing/arranging," "installing/assembling," and/or "ordering" the object, or the like.

Furthermore, those skilled in the art will recognize that boundaries between the above-described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The description and drawings are, accordingly, to be regarded in an illustrative rather than in a restrictive sense.

Although some specific embodiments of the present disclosure have been described in detail with examples, it should be understood by a person skilled in the art that the above examples are only intended to be illustrative but not to limit the scope of the present disclosure. The embodiments disclosed herein can be combined arbitrarily with each other, without departing from the scope and spirit of the present disclosure. It should be understood by a person skilled in the art that the above embodiments can be modified without departing from the scope and spirit of the present disclosure. The scope of the present disclosure is defined by the attached claims.

What is claimed is:

1. A coupler, comprising:
   a first coupling member comprising a first substrate, and a first signal path, a first sub-path of a second signal path, and a fourth sub-path of a fourth signal path located on the first substrate, the first sub-path of the second signal path configured to couple a portion of a signal in the first signal path into the second signal path and the first signal path configured to couple a portion of a signal in the fourth signal path into the first signal path;
   a second coupling member vertically stacked with the first coupling member, the second coupling member comprising a second substrate, and a second sub-path of the second signal path, a third signal path, and a third sub-path of the fourth signal path located on the second substrate, the third signal path configured to couple a portion of a signal in the second signal path into the third signal path and the third sub-path of the fourth signal path configured to couple a portion of a signal in the third signal path into the fourth signal path;
   a first port and a fourth port located on the first substrate and connected to opposite ends of the first signal path;
   a second port and a third port located on the second substrate connected to opposite ends of the third signal path;
   a shielding member between the first substrate and the second substrate and configured to shield the first coupling member and the second coupling member from one another, the shielding member having a first and second connection through-holes;
   a first connection member within the first connection through-hole and electrically connected between the first sub-path and the second sub-path; and
   a second connection member within the second connection through-hole and electrically connected between the third sub-path and the fourth sub-path.

2. The coupler according to claim 1, wherein a first length of the first signal path and a second length of the second signal path are configured such that a portion of a signal that passes through the first signal path is in phase with another portion of the signal that passes through the second signal path; and
   a third length of the third signal path and a fourth length of the fourth signal path are configured such that a portion of a signal that passes through the third signal path is in phase with another portion of the signal that passes through the fourth signal path.

3. The coupler according to claim 2, wherein the first length is equal to the third length; and/or
   the second length is equal to the fourth length.

4. The coupler according to claim 2, wherein the second length is greater than the first length; and/or
   the fourth length is greater than the third length.

5. The coupler according to claim 1, wherein a first coupling segment of the first signal path is parallel to a first sub-segment of the first sub-path such that the first signal path is coupled with the first sub-path, and a fourth coupling segment of the first signal path is parallel to a fourth sub-segment of the fourth sub-path such that the first signal path is coupled with the fourth sub-path; and
- a second coupling segment of the third signal path is parallel to a second sub-segment of the second sub-path such that the third signal path is coupled with the second sub-path, and a third coupling segment of the third signal path is parallel to a third sub-segment of the third sub-path such that the third signal path is coupled with the third sub-path.

6. The coupler according to claim 5, wherein a signal travelling direction in the first coupling segment is opposite a signal travelling direction in the first sub-segment;
- a signal travelling direction in the fourth coupling segment is opposite a signal travelling direction in the fourth sub-segment;
- a signal travelling direction in the second coupling segment is opposite a signal travelling direction in the second sub-segment; and
- a signal travelling direction in the third coupling segment is opposite a signal travelling direction in the third sub-segment.

7. The coupler according to claim 1, wherein the first sub-path and the fourth sub-path are side-by-side on a same side of the first substrate; and
- the second sub-path and the third sub-path are side-by-side on a same side of the second substrate.

8. The coupler according to claim 1, wherein the first sub-path is vertically stacked with the third sub-path; and
- the second sub-path is vertically stacked with the fourth sub-path.

9. The coupler according to claim 1, wherein projections of the first port, the second port, the third port, and the fourth port in a vertical direction are spaced apart from one another.

10. The coupler according to claim 1, wherein the first coupling member further comprises:
- a first absorption path and a first absorption member located on the first substrate, the first absorption path connecting a first sub-segment of the first sub-path that is coupled with the first signal path and the first absorption member; and
- a fourth absorption path and a fourth absorption member located on the first substrate, the fourth absorption path connecting a fourth sub-segment of the fourth sub-path that is coupled with the first signal path and the fourth absorption member; and
- wherein the second coupling member further comprises:
- a second absorption path and a second absorption member located on the second substrate, the second absorption path connecting a second sub-segment of the second sub-path that is coupled with the third signal path and the second absorption member; and
- a third absorption path and a third absorption member located on the second substrate, the third absorption path connecting a third sub-segment of the third sub-path that is coupled with the third signal path and the third absorption member.

11. The coupler according to claim 10, wherein at least one of the first absorption member, the second absorption member, the third absorption member, and the fourth absorption member comprises a resistor.

12. The coupler according to claim 10, wherein the first coupling member further comprises a first grounding member located on an opposite side of the first substrate with respect to the first absorption member and the fourth absorption member, the first absorption member electrically connected with the first grounding member via a first conductive through-hole on the first substrate, and the fourth absorption member electrically connected with the first grounding member via a fourth conductive through-hole on the first substrate; and
- the second coupling member further comprises a second grounding member located on an opposite side of the second substrate with respect to the second absorption member and the third absorption member, the second absorption member electrically connected with the second grounding member via a second conductive through-hole on the second substrate, and the third absorption member electrically connected with the second grounding member via a third conductive through-hole on the second substrate.

13. The coupler according to claim 12, wherein the shielding member is electrically connected between the first grounding member and the second grounding member.

14. A coupler, comprising:
- a first coupling member comprising a first substrate, and a first signal path, a first sub-path of a second signal path, and a fourth sub-path of a fourth signal path located on the first substrate, the first sub-path of the second signal path configured to couple a portion of a signal in the first signal path into the second signal path and the first signal path configured to couple a portion of a signal in the fourth signal path into the first signal path;
- a second coupling member vertically stacked with the first coupling member, the second coupling member comprising a second substrate, and a second sub-path of the second signal path, a third signal path, and a third sub-path of the fourth signal path located on the second substrate, the third signal path configured to couple a portion of a signal in the second signal path into the third signal path and the third sub-path of the fourth signal path configured to couple a portion of a signal in the third signal path into the fourth signal path;
- a shielding member between the first substrate and the second substrate and configured to shield the first coupling member and the second coupling member from one another, the shielding member having a first and second connection through-holes;
- a first connection member within the first connection through-hole and electrically connected between the first sub-path and the second sub-path; and
- a second connection member within the second connection through-hole and electrically connected between the third sub-path and the fourth sub-path,
- wherein a first length of the first signal path and a second length of the second signal path are configured such that a portion of a signal that passes through the first signal path is in phase with another portion of the signal that passes through the second signal path; and
- a third length of the third signal path and a fourth length of the fourth signal path are configured such that a portion of a signal that passes through the third signal path is in phase with another portion of the signal that passes through the fourth signal path.

* * * * *